United States Patent [19]

Sugawara et al.

[11] Patent Number: 5,026,134
[45] Date of Patent: Jun. 25, 1991

[54] OPTICAL COMMUNICATION APPARATUS WITH BASE FOR FIXING ELEMENTS

[75] Inventors: Mitsuru Sugawara; Akitoshi Yoshinaga; Fumihiko Shimizu; Masayuki Takami, all of Kanagawa, Japan

[73] Assignee: Kabushiki Kaisha Toshiba, Kawasaki, Japan

[21] Appl. No.: 316,666

[22] Filed: Feb. 28, 1989

[30] Foreign Application Priority Data

Mar. 1, 1988 [JP] Japan .................................. 63-45809
Mar. 25, 1988 [JP] Japan .................................. 63-69637

[51] Int. Cl.⁵ .............................................. G02B 6/12
[52] U.S. Cl. .................................. 350/96.11; 350/96.2
[58] Field of Search ............... 357/30 M, ; 350/96.11, 350/96.15, 96.2

[56] References Cited

U.S. PATENT DOCUMENTS

| | | | |
|---|---|---|---|
| 4,627,687 | 12/1986 | Dorn et al. | 350/96.2 |
| 4,701,013 | 10/1987 | Jurczyszyn et al. | 350/96.2 |
| 4,702,556 | 10/1987 | Ishii et al. | 350/320 |
| 4,787,696 | 11/1988 | Norris et al. | 350/96.2 |
| 4,803,361 | 2/1989 | Aiki et al. | 350/96.2 |
| 4,803,689 | 2/1989 | Shibanuma | 350/96.2 X |
| 4,807,956 | 2/1989 | Tournereau et al. | 350/96.2 |

FOREIGN PATENT DOCUMENTS 62-89008 4/1987 Japan .

OTHER PUBLICATIONS

IECEJ Technical Report CS 85-11; K. Katoh, et al.; Aug. 23, 1985.

Primary Examiner—John D. Lee
Assistant Examiner—John Ngo
Attorney, Agent, or Firm—Oblon, Spivak, McClelland, Maier & Neustadt

[57] ABSTRACT

An optical communication apparatus which comprises a printed circuit board, plural circuit elements fixed to the printed circuit board, the circuit elements having terminals extended to the printed circuit board, a photosensitive glass base fixed to the printed circuit board, various optical components accurately fixed to the glass base, the optical elements respectively having plural leads, and corresponding conductive members for electrically connecting the terminals of the circuit elements and the corresponding leads of the optical components, the conductive members each having a rigidity smaller than the rigidity of the corresponding leads of the optical components.

16 Claims, 7 Drawing Sheets

OPTICAL COMMUNICATION APPARATUS WITH BASE FOR FIXING ELEMENTS

BACKGROUND OF THE INVENTION

1. Field of the Invention

This invention relates to an optical communication apparatus, and more particularly to an optical communication apparatus having a base to which optoelectronic semiconductor elements and a wavelength division multi/demultiplexer are accurately fixed.

2. Description of the Prior Art

Optical communication systems using optical fibers have been increasingly applied to wider fields. According to such circumstances, the optical circuit components for use in such an optical communication system are required to be compact in size, and low in production cost. For example, a wavelength division multi/demultiplexer module is generally used for a wavelength multiplex transmission system. Such module incorporates opto-semiconductor elements such as semiconductor lasers, light emitting diodes and photodiodes. Further, the module incorporates a wavelength division multi/demultiplexer provided with multilayered films, and optical fibers. These components are united, and accurately fixed to a base made of glass or ceramic. The thus constituted module can achieve compactness and lower production cost as compared to a discrete configuration.

Figure 7A:
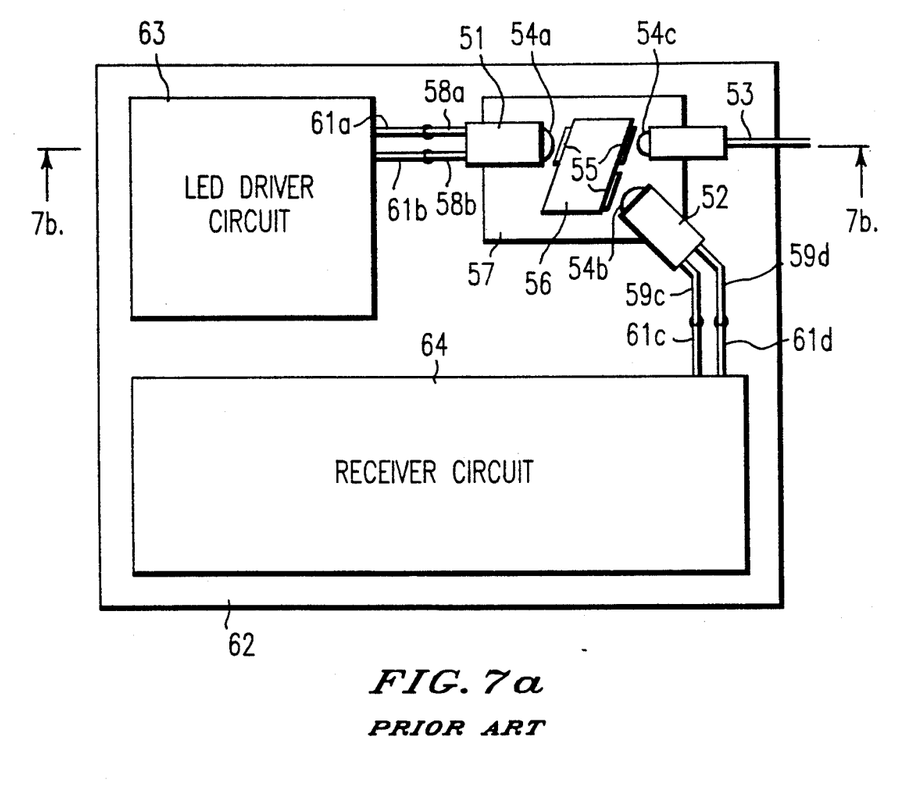
FIG. 7a is a plan view illustrating a conventional wavelength division multi/demultiplex transmitter/receiver.
Figure 7B:
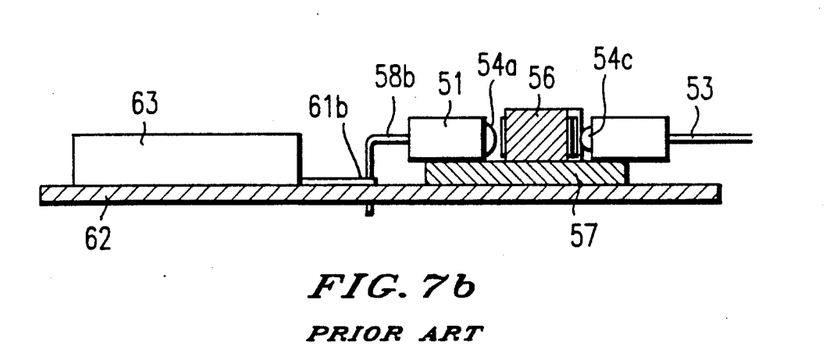

FIGS. 7a and 7b show a conventional optical wave synthesizer/analyzer module. In FIG. 7a, the module incorporates a light-emitting diode (LED) 51, a photodiode 52, an optical fiber 53, and an optical wave synthesizer/analyzer prism 56 provided with dielectric film-multilayered filters 55 adhering thereto. Further, the module incorporates optical lenses 54a, 54b and 54c. All the components are accurately fixed by soldering to a ceramic base 57. The ceramic base 57 is disposed on a printed circuit board 62. Further, an LED (light-emitting diode) driver circuit element 63 and a signal processing circuit element 64 are disposed on the printed circuit board 62 in the vicinity of the base 57. The respective terminals (not shown) of the circuit elements 63 and 64 are connected through printed lines to electrode pads 61a, 61b, 61c and 61d formed on the printed circuit board 62. The leads 58a and 58b of the LED 51 and the leads 59a and 59b of the photo-diode 52 are respectively connected by soldering to the electrode pads 61a, 61b, 61c and 61d.

In this configuration, the leads 58a and 58b of the LED 51 and the leads 59a and 59b of the photo-diode 52 are directly connected by soldering to the electrode pads 61a and 61b and the electrode pads 61c and 61d, respectively. Thus, during the connection, external forces are acted on the LED 51 and the photo-diode 52. As a result, the prescribed positional relationship between the optical components are inevitably changed due to the plastic deformation of the solder used for connection. Further, thermal stress occurs on the solder due to the difference of the thermal expansion coefficients between the base 57 and the printed circuit board 62. Such thermal stress accelerates the creep of the solder, and causes the shift in the positional relationship between the optical components. As a result, the reliability of the conventional optical module is significantly deteriorated.

Figure 8:
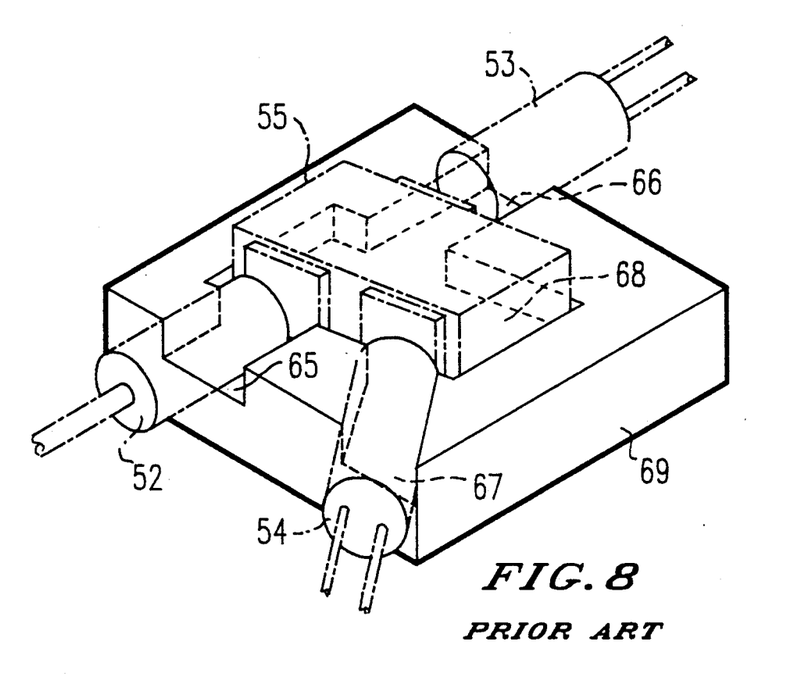
FIG. 8 is a perspective view illustrating an essential part of another conventional wavelength division multi/demultiplex transmitter/receiver.

In the above-described configuration, the optical wave synthesizer/analyzer module is accurately fixed to the flat base. However, there has been disclosed another technique in which optical components are accurately positioned at the prescribed positions on the surface of a photosensitive glass base. FIG. 8 shows an optical circuit component manufactured by use of a conventional technique. In FIG. 8, a photosensitive glass base 69 has the prescribed grooves 65, 66 and 67 formed by accurate etching processes. Packages 52, 53 and 54, and a wavelength division multi/demultiplexer prism 56 are positioned respectively in the grooves 65, 66, 67 and 68, and then accurately fixed to the base 69 by means of soldering. The package 52 incorporates a combination of optical fibers and lenses. The packages 53 and 54 each contain opto-semiconductor elements associated with the lenses. In this configuration, the respective optical components can be positioned in a prescribed arrangement with substantially no need for additional adjustments. Thus, this technique has advantages such that optical circuit components can be manufactured at relatively lower costs.

However, such conventional technique of soldering optical components to a photosensitive glass base still has problems in terms of work efficiency and productivity. Specifically, the soldering portions of the photosensitive glass base may be only etched, or for better quality, a thermal process may be added thereafter to produce a ceramic state. Thus, the types of solder that can be applied to this technique are limited to solders used for ceramic bonding. As a result, there is little flexibility in variation of the solder melting point. Further, ultrasonic oscillation must be additionally applied to achieve satisfactory soldering. Therefore, the work efficiency of assembling optical components becomes lower. Thus, the productivity of manufacturing the optical communication module inevitably becomes lower.

Figure 9:
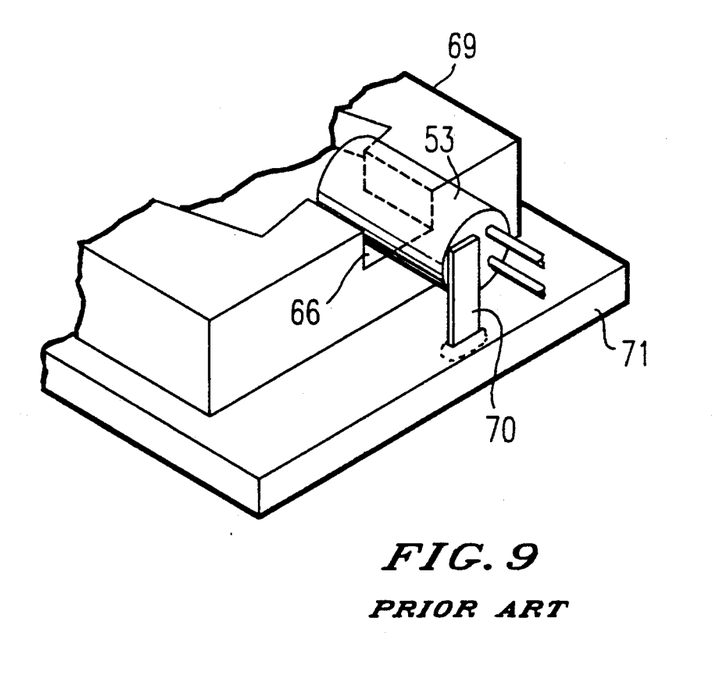
FIG. 9 is a perspective view illustrating an essential part of still another conventional wavelength division multi/demultiplex transmitter/receiver.

FIG. 9 shows an optical circuit component manufactured by use of a conventional technique. In FIG. 9, a photosensitive glass base 69 has the prescribed groves thereon formed by accurate etching processes. A package 53 that incorporates opto-semiconductor elements and lenses is accurately fixed to the base 69. Specifically, in this configuration, the package 53 can be attached to one of the grooves of the base 69 with substantially no need for additional adjustments. Thus, this technique has been applied to manufacturing processes of optical components such as an optical brancher/coupler and a wavelength division multi/demultiplexer.

However, in the conventional configuration, when the package 53 incorporates an element which generates heat, such as a semiconductor laser, a structural problem in heat radiation arises. Specifically, in FIG. 9, one end of a heat-radiating member 70 is attached directly to the package 53. The other end of the member 70 is attached to a heat sink 71. In this configuration, stress occurs with respect to the base 69 and the package 53 when the member 70 is fixed to the heat sink 71. Moreover, the elasticity of the member 70 causes additional stress with respect to the base 69 and the package 53. The stresses may cause the package 53 to deteriorate in optical and mechanical characteristics, such as by deviation of the optical axis, or other damage.

SUMMARY OF THE INVENTION

Accordingly, one object of the present invention is to provide an optical communication module substantially free from thermal stress-caused defects.

Another object of the present invention is to provide a photosensitive glass base to which packages incorporating optical components can be easily attached in accurate positional relationships by soldering, using a variety of possible solders.

Still another object of the present invention is to provide a heat radiation structure that can radiate heat while reducing stresses in the structure.

Briefly, in accordance with one aspect of the present invention, there is provided an optical communication apparatus which comprises a first component-mounting member, a plurality of optical components fixed in the first component-mounting member, the optical components having plural leads, a second component-mounting member to which the first component-mounting member is fixed, a plurality of connecting members provided on the second component-mounting member, and a plurality of conductive members for electrically connecting the leads of the optical components and the connecting members, the conductive members having rigidity smaller than that of the leads of the optical components.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1b is a cross-sectional view taken along line A—A of FIG. 1a;

FIG. 2b is a cross-sectional view taken along line A—A of FIG. 2a;

FIG. 3b is a cross-sectional view taken along line A—A of FIG. 3a;

FIG. 7b is a cross-sectional view taken along line A—A of FIG. 7a;

DESCRIPTION OF THE PREFERRED EMBODIMENTS

Referring now to the drawings, wherein like reference numerals designate identical or corresponding parts throughout the several views, and more particularly to FIG. 1 thereof, a first embodiment of this invention will be described.

Figure 1A:
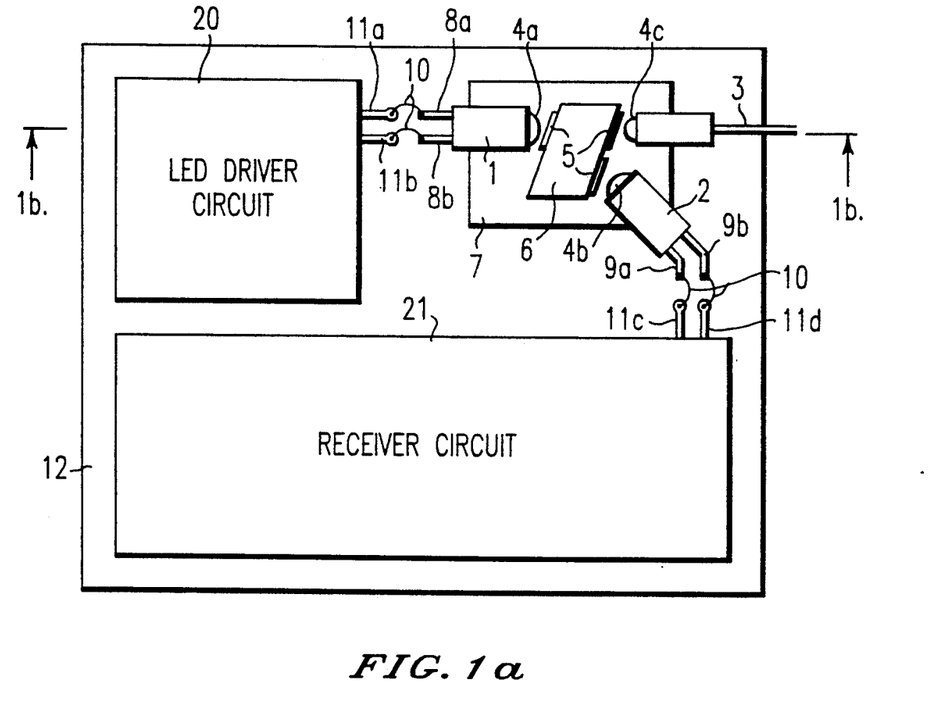
FIG. 1a is a plan view illustrating a first embodiment according to the present invention.
Figure 1B:
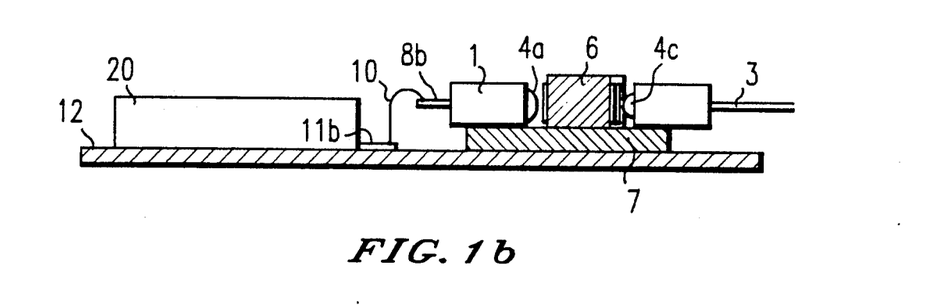

FIGS. 1a and 1b are schematic diagrams illustrating a first embodiment of the present invention. In FIGS. 1a and 1b, a light emitting diode (LED) 1, a photo-diode (PD) 2, and an optical fiber 3 are united respectively with optical lenses 4a, 4b and 4c so as to form collimators. The collimators convert light emitted by the LED and the optical fiber into collimated light beams and produce the same. The collimators also receive collimated light beams and focus the same on prescribed optical positions. The LED 1, the photo-diode 2, and the optical fiber 3 are fixed by soldering or the like to a base 7 together with a prism 6 having dielectric multi-layered filters 5. They coincide with each other in terms of their optical axes. Leads 8a and 8b of the LED 1 and leads 9a and 9b of the photo-diode 2 are connected through gold wires 10 to electrode pads 11a, 11b, 11c and 11d, respectively, on a printed circuit board 12. The electrode pads 11a, 11b, 11c and 11d are connected respectively through printed lines to the terminals of an LED driver circuit 20 and a receiver circuit 21. In this case, the gold wires 10 are connected to provide a curved portions in the middle of each wire 10.

Specifically, the gold wires 10 are about 25 μm in diameter, and have a rigidity much smaller than that of the respective leads 8a, 8b, 9a and 9b. Thus, substantially all of stresses produced by the difference in thermal expansion between the base 7 and the printed circuit board 12 caused by changes of environmental temperatures are absorbed by the curved portions of the gold wires 10. As a result, such stresses are substantially eliminated from the fixed portions of the LED 1 and the photo-diode 2. Therefore, the deterioration in optical coupling characteristics caused by the shift in the positional relationships between the optical components can be avoided. Also, the creep of the solder used for connecting the optical components is not accelerated. Further, the curved portions of the gold wires 10 can absorb vibrations.

Figure 2A:
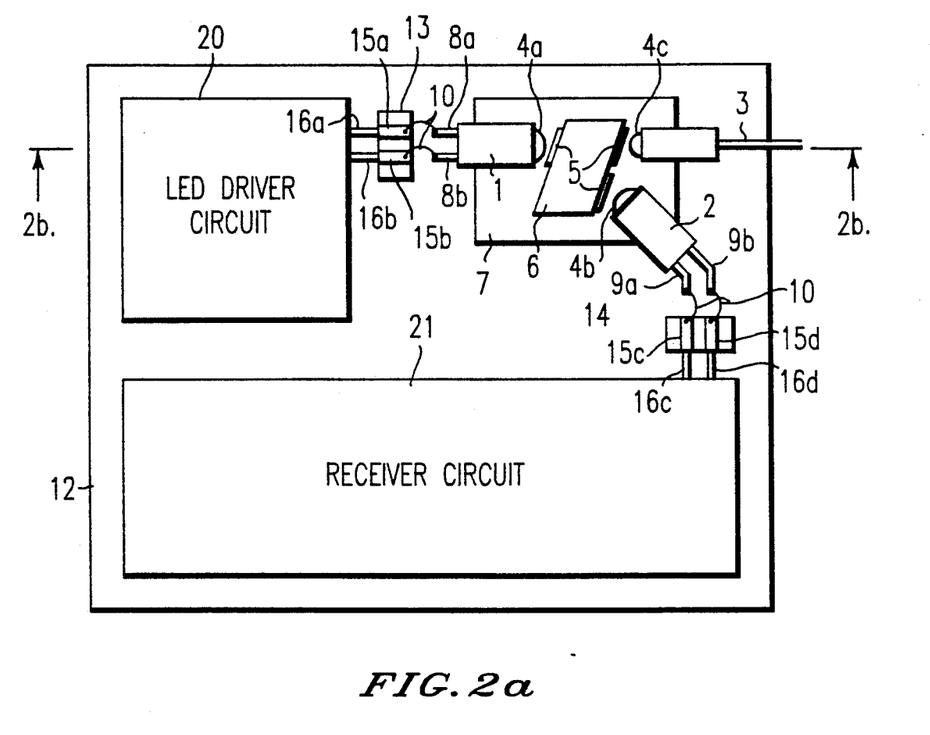
FIG. 2a is a plan view illustrating a second embodiment according to the present invention.
Figure 2B:
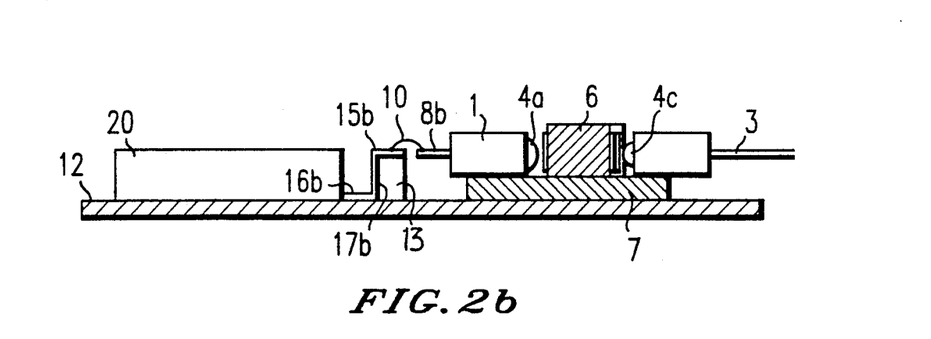

FIGS. 2a and 2b show a second embodiment of the present invention. In FIG. 2a, electrode blocks 13 and 14 made of ceramic or the like are provided between the LED 1 and the LED driver circuit 20, and also between the PD 2 and the signal processing circuit 21. The electrode blocks 13 and 14 have electrode patterns 15a, 15b, 15c, and 15d formed thereon. Leads 8a, 8b, 9a and 9b of an LED 1 and the PD 2 are respectively connected to the electrode patterns 15a, 15b, 15c and 15d through gold wires 10. In FIG. 2b, the electrode pattern 15b extends so as to form a side electrode pattern 17b. The side electrode pattern 17b is connected by soldering to one of terminals of the LED driver circuit 20 through a printed line 16b.

In this embodiment, the heights of the electrode blocks 13 and 14 are substantially the same as those of the leads 8a and 8b of the LED 1 and the leads 9a and 9b of the PD 2. This facilitates the work of wire bonding which is usually performed under the microscope. Moreover, the gold wires 10 and the electrode patterns 15a, 15b, 15c and 15d are connected by the use of techniques such as thermal pressure bonding or ultrasonic wave pressure bonding. Thus, the adverse effects caused by the heat generated by soldering the electrode patterns 17 and printed lines 16 can be significantly avoided.

Figure 3A:
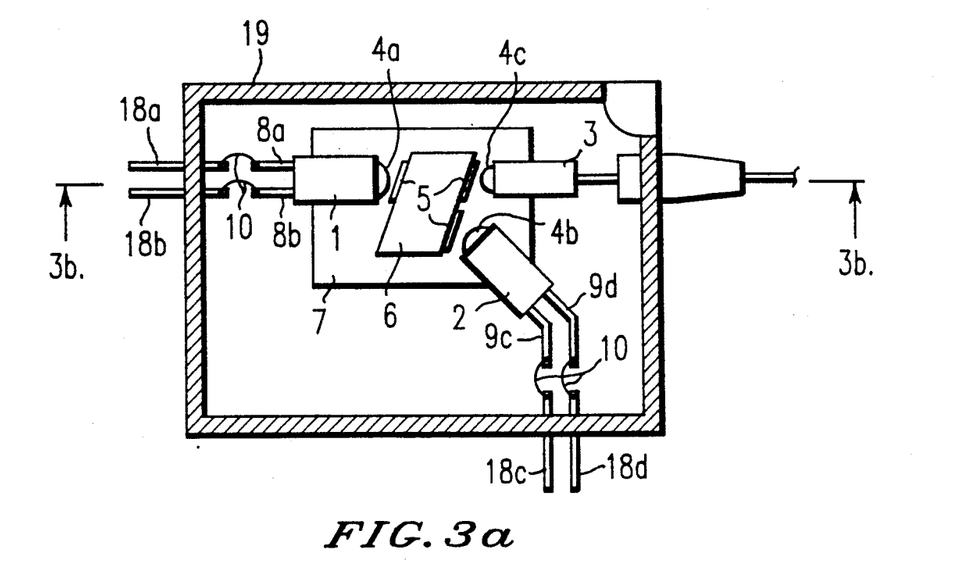
FIG. 3a is a plan view illustrating a third embodiment according to the present invention.
Figure 3B:
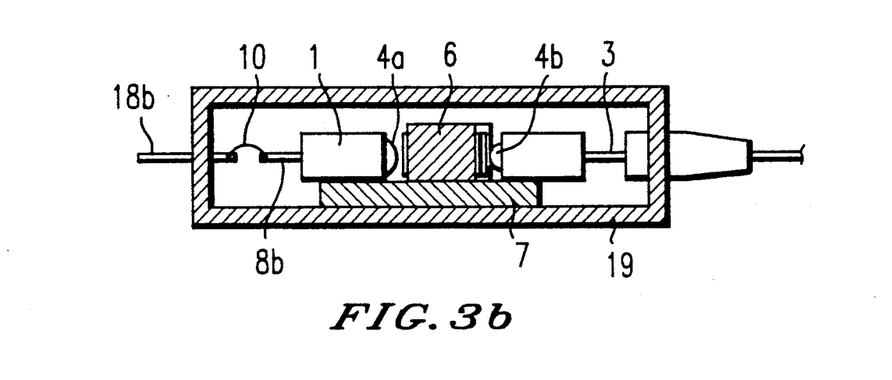

FIGS. 3a and 3b show a third embodiment of the present invention. In FIG. 3a, a base 7 to which optical components are fixed is incorporated in a case 19. Connection terminals 18a, 18b, 18c and 18d are provided on the sidewalls of the case 19 and electrically insulated each other. The heights of the connection terminals 18a, 18b, 18c and 18d are substantially the same as those of leads 8a, 8b, 9a and 9b of the LED 1 and the PD 2. The connection therebetween is achieved by the use of gold wires 10.

In this embodiment, substantially all of stresses produced by the difference of thermal expansion between the case 19 and the base 7 caused by changes of environmental temperatures are absorbed by the curved portions of the gold wires 10. Thus, even when connection and disconnection with peripherical electron circuits are repeated, the deterioration in the optical coupling characteristics can be avoided. As a result, the work efficiency of manufacturing the module according to the present invention can be significantly enhanced.

Figure 4:
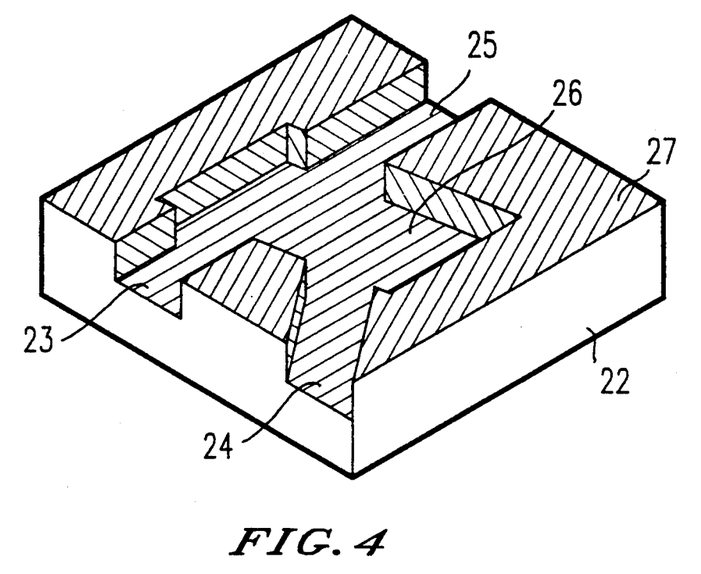
FIG. 4 is a perspective view illustrating an essential part of a fourth embodiment according to the present invention.

Next, a fourth embodiment according to the present invention will be described with reference to FIG. 4. In the above-described embodiments, various optical components are accurately fixed by soldering directly to the flat base. However, in this embodiment, as shown in FIG. 4, a base 22 is made of photosensitive glass particularly prepared by the chemical etching process. The glass base 22 has grooves 23, 24, 25 and 26 formed by the use of a selective etching process.

Specifically, only the portions of the base 22 on which the grooves are formed are selectively exposed to ultraviolet rays, thermally processed, and etched. Further, the shaded portion, i.e., the entire upper surface of the base 22 is coated with a three-layer metal film 27. Otherwise, at least all the inner walls of the grooves must be coated with such metal film. The metal film 27 consists of three layers made of chromium (closest to the base surface), nickel and gold (top). The thickness of the gold layer is 2 μm at a minimum. Within the respective grooves 23, 24, 25 and 26 coated with the metal film 27, optical components (not shown) are accurately fixed by soldering. Thus, such soldering can be achieved by use of the solder which is employed to connect conventional electric circuits. Naturally, the solder for glass or ceramics can also be used. As a result, the melting points of the solder to be used can be freely selected depending on the properties of the optical components to be fixed to the base.

In addition, the use of the solder which is employed to connect conventional electric circuits can eliminate such a particular process as application of ultrasonic oscillation. Thus, the work efficiency of assembling optical components can be significantly enhanced. As a result, the productivity of manufacturing the optical circuit components can also be improved.

Figure 5:
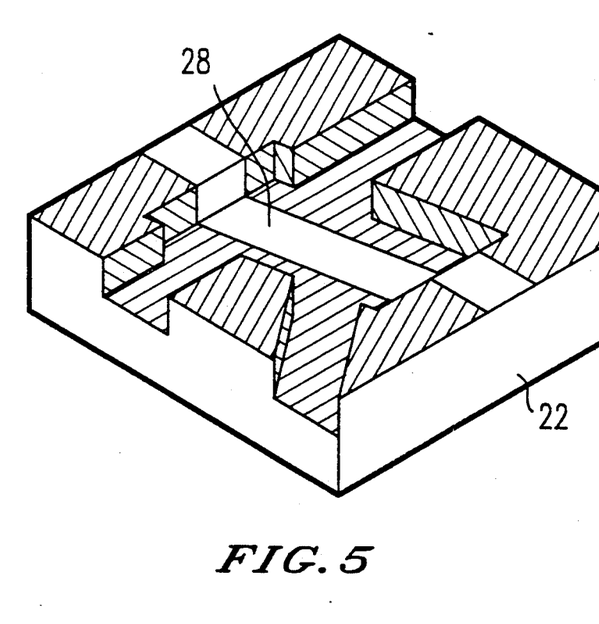
FIG. 5 is a perspective view illustrating an essential part of a fifth embodiment according to the present invention.

FIG. 5 shows a fifth embodiment according to the present invention. In FIG. 5, an isolation region 28 in which no metal film is coated is provided on the part of the base 22. Thus, the portions to which optical components are fixed can be electrically insulated. The isolation region 28 is formed by the use of a masking technique. When the light emitting portion is isolated from the light receiving portion, their high frequency characteristics are improved. As a result, a satisfactory electrical isolation can be achieved between the light-emitting and receiving portions. Therefore, the use of this base can achieve a higher transmission speed. In addition, the electric potentials of the light-emitting and -receiving portions can be freely determined. Thus, peripheral electronic circuits can be easily mounted without limitation in terms of electric potentials.

Figure 6:
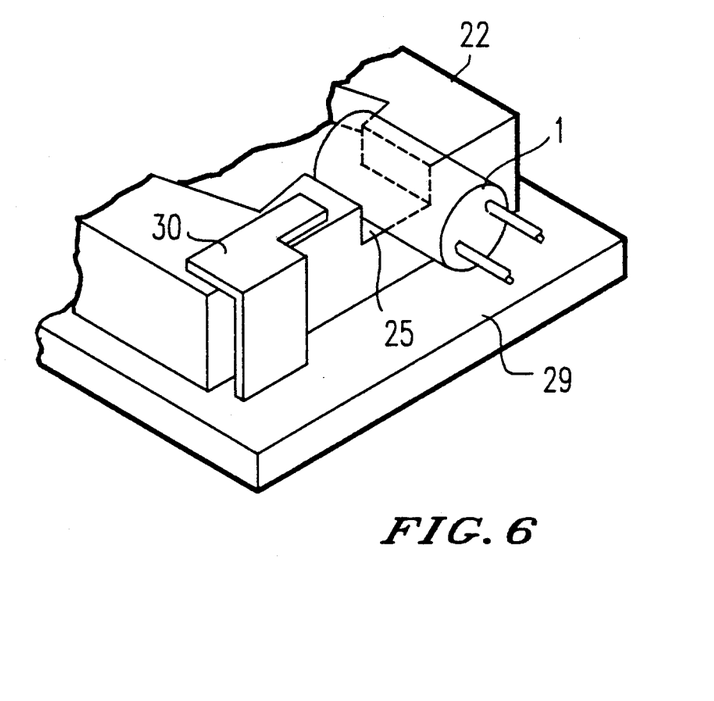
FIG. 6 is a perspective view illustrating an essential part of a sixth embodiment according to the present invention.

Next, a sixth embodiment according to the present invention will be described with reference to FIG. 6. In FIG. 6, a package 1 incorporates a LED or semiconductor laser and a collimating lens. A photosensitive glass base 22 has a groove 25 formed by accurate etching processes. The entire upper surface of the base 22 is coated with the same metal film as that in the fourth and fifth embodiments. A heat sink 29 is made of alumina plated with gold. The package 1 is accurately fixed within the groove 25 by soldering.

The package 1 is made of a material, such as an alloy of tungsten and copper, and is satisfactorily thermally combined with the semiconductor laser chip. A heat-radiating member 30 is made of copper. One end of the member 30 is fixed to a portion close to a portion to which the package 1 is attached. The other end of the member 30 is fixed to the upper surface of the heat sink 29. Both ends are fixed by soldering. However, the soldered portions are not shown. In this configuration, heat generated from the semiconductor laser during operation is conducted to the heat sink 29 by way of the package 1, the base 22, the heat-radiating member 30, and the solder therebetween. As a result, satisfactory heat radiation can be efficiently achieved without the occurrence of stresses with respect to the package 1 and the base 22.

In this embodiment, the soldering process is performed as follows. First, the base 22 is entirely heated, and the package 1 and the member 30, both being previously plated with solder are attached simultaneously to the heated base 22. The solder between the base 22 and both the package 1 and the member 30 is melted, and the connection therebetween is completed. The base 22, package 1 and the member 30 are thus united, and then accurately fixed to the hear sink 29 by soldering.

Moreover, the connection of the base 22, package 1, member 30 and heat sink 29 is achieved by soldering. However, this connection may also be achieved by use of any other materials having a satisfactory thermal conductivity, such as polymer adhesive, i.e., epoxy resin, or the like, for example.

Obviously, numerous additional modifications and variations of the present invention are possible in light of the above teachings. It is therefore to be understood that within the scope of the appended claims, the invention may be practiced otherwise than as specifically described herein.

What is claimed is:

1. An optical communication apparatus comprising:
   a first component-mounting member having a metal film coating on at least one surface;
   a plurality of optical components fixed to said first component-mounting member, one of said optical components having a lead;
   a second component-mounting member for fixedly supporting said first component-mounting member;
   a connecting member on said second component-mounting member; and
   a conductive member for electrically connecting the lead of said optical component to corresponding said connecting member, said conductive member having a rigidity smaller than the rigidity of the corresponding leads of said optical components for absorbing thermal stresses on the apparatus.

2. The apparatus of claim 1, wherein said conductive member include one of metal wire, metal ribbon and metal meshed wire.

3. The apparatus of claim 2, wherein said metal wire include one of gold, aluminum and copper, and have a maximum diameter of about 100 μm.

4. The apparatus of claim 2, wherein said metal ribbon or said metal meshed wire include gold, aluminum or copper, and have a maximum width of about 1 mm and a maximum thickness of about 100 μm.

5. The apparatus of claim 1, wherein the second component mounting member includes a substantially planar surface, the connecting member and corresponding lead being aligned at substantially an equal distance from the planar surface for connection by the conductive member.

6. The apparatus of claim 1, wherein said first component-mounting member includes a groove, corresponding to the optical component.

7. The apparatus of claim 6, wherein said first component-mounting member includes chemically etchable photosensitive glass 8. The apparatus of claim 6, wherein the groove has inner walls, and said metal film coating is on the inner walls.

9. The apparatus of claim 8, wherein said first component-mounting member includes a mounting surface and a coating of metal film is on the mounting surface.

10. The apparatus of claim 8, wherein said first component-mounting member has a heat sink member attached thereto.

11. The apparatus of claim 10, wherein said first component-mounting member has an elongated heat-radiating member having one end attached to the first component-mounting member in proximity to the grooves, and another end attached to said heat sink member.

12. An optical communication apparatus comprising:
a first component-mounting member having a metal film coating on at least one surface;
a plurality of optical components including an optical fiber element, and semiconductor elements having semiconductor light-emitting element and light-receiving element, coupling said optical fiber, said semiconductor elements having plural leads, said plural optical components being fixed to said first component-mounting member;
a second component-mounting member for fixedly supporting said first component-mounting member;
a semiconductor light-emitting element driver circuit element and a receiver circuit element, said each circuit element having terminals extended to said second component-mounting member;
a plurality of conductive members for electrically connecting the leads of said semiconductor light-emitting element to corresponding ones of said extended terminals of said semiconductor light-emitting element driver circuit element, and for electrically connecting the leads of said semiconductor light-receiving element to corresponding ones of said extended terminals of said receiver circuit element, said plural conductive members each having a rigidity smaller than the rigidity of the corresponding leads of said semiconductor elements.

13. The apparatus of claim 12, wherein said first component-mounting member includes a base of $Al_2O_3$, has an upper surface, and said metal film coating is on the upper surface.

14. The apparatus of claim 12, wherein said second component-mounting member includes a printed circuit board.

15. An optical communication apparatus comprising:
a base having a metal film coating on at least one surface;
a plurality of optical components including an optical fiber element, and semiconductor elements having semiconductor light-emitting element and light-receiving element, coupling said optical fiber, said semiconductor elements having plural leads, said plural optical components being fixed to said base;
a case having a substantially planar inner surface, the inner surface fixedly supporting said base;
a plurality of connecting terminals provided penetrating said case at positions facing to corresponding ones of the leads of said semiconductor elements;
a plurality of conductive members for electrically connecting said connecting terminals to corresponding ones of the leads of said semiconductor elements, said plural conductive members each having a rigidity smaller than the rigidity of the corresponding leads of said semiconductor elements.

16. The apparatus of claim 15, wherein said connecting terminals and corresponding leads being aligned at substantially an equal distance from the substantially planar inner surface of said base for connection by said conductive members.

* * * * *